United States Patent
Ogawa

(10) Patent No.: US 11,908,737 B2
(45) Date of Patent: *Feb. 20, 2024

(54) METHOD OF MANUFACTURING SEMICONDUCTOR DEVICE, SUBSTRATE PROCESSING APPARATUS AND RECORDING MEDIUM

(71) Applicant: KOKUSAI ELECTRIC CORPORATION, Tokyo (JP)

(72) Inventor: Arito Ogawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/842,409

(22) Filed: Jun. 16, 2022

(65) Prior Publication Data

US 2022/0319919 A1  Oct. 6, 2022

Related U.S. Application Data

(63) Continuation of application No. 16/990,683, filed on Aug. 11, 2020, now Pat. No. 11,393,719, which is a continuation of application No. PCT/JP2018/012089, filed on Mar. 26, 2018.

(51) Int. Cl.
*H01L 21/768*  (2006.01)
*H01L 21/285*  (2006.01)

(52) U.S. Cl.
CPC .... *H01L 21/76877* (2013.01); *H01L 21/7684* (2013.01); *H01L 21/28568* (2013.01)

(58) Field of Classification Search
None
See application file for complete search history.

(56) References Cited

U.S. PATENT DOCUMENTS

| 5,306,666 A | 4/1994 | Izumi |
| 6,048,792 A | 4/2000 | Ichikawa et al. |
| 11,393,719 B2 * | 7/2022 | Ogawa .............. H01L 21/28562 |

(Continued)

FOREIGN PATENT DOCUMENTS

| JP | 10-012732 A | 1/1998 |
| JP | 2003-142425 A | 5/2003 |

(Continued)

OTHER PUBLICATIONS

International Search Report, PCT/JP2018/012089, dated May 22, 2018, 2 pgs.

(Continued)

*Primary Examiner* — Xiaoming Liu
(74) *Attorney, Agent, or Firm* — Volpe Koenig

(57) ABSTRACT

There is provided a technique that performs: (a) forming a first metal film by supplying a plurality of times a first metal-containing gas and a first reducing gas without being mixed with each other to a substrate having a concave portion in a surface of the substrate; and (b) forming a second metal film on the first metal film by supplying a plurality of times at least a second metal-containing gas and a second reducing gas different from the first reducing gas without being mixed with each other or by simultaneously supplying at least a second metal-containing gas and a second reducing gas different from the first reducing gas, to the substrate.

14 Claims, 9 Drawing Sheets

(56) References Cited

U.S. PATENT DOCUMENTS

| | | |
|---|---|---|
| 2003/0003729 A1 | 1/2003 | Kawano et al. |
| 2010/0144140 A1 | 6/2010 | Chandrashekar et al. |
| 2012/0070982 A1* | 3/2012 | Yu .................... H01L 21/76843 |
| | | 438/653 |
| 2015/0024592 A1* | 1/2015 | Chandrashekar ........................... |
| | | H01L 21/28568 |
| | | 438/675 |
| 2015/0037972 A1* | 2/2015 | Danek ............... H01L 21/76841 |
| | | 438/618 |
| 2015/0111378 A1 | 4/2015 | Ogawa et al. |
| 2018/0053660 A1 | 2/2018 | Jandl et al. |
| 2020/0144066 A1 | 5/2020 | Jandl et al. |

FOREIGN PATENT DOCUMENTS

| | | |
|---|---|---|
| JP | 2003-160867 A | 6/2003 |
| JP | 2008-283220 A | 11/2008 |
| JP | 2010-153852 A | 7/2010 |
| JP | 2015-109419 A | 6/2015 |
| KR | 10-2018-0019487 A | 2/2018 |

OTHER PUBLICATIONS

Japanese Office Action dated May 25, 2021 for Japanese Patent Application No. 2020-510187.
Korean Office Action dated Jun. 2, 2021 for Japanese Patent Application No. 10-2020-7004002.
Chinese Office Action dated Mar. 28, 2023 for Chinese Patent Application No. 20180050799.1.

* cited by examiner

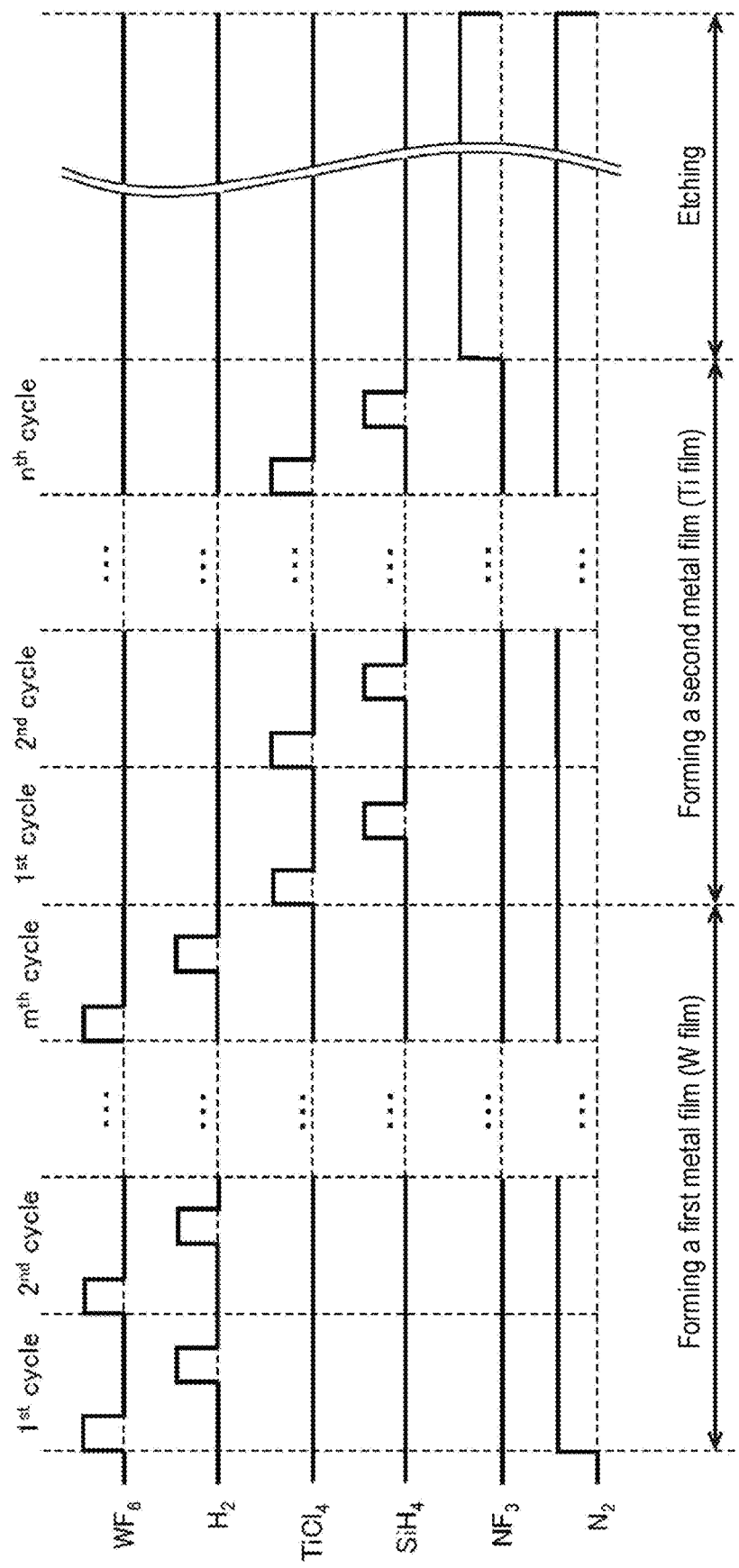

|  | Total processing time of W film-forming process |
|---|---|
| Example | 5.98hr |
| Comparative Example | 9.75hr |

| Deposition rate of first W film | 0.023nm/cycle |
|---|---|
| Deposition rate of second W film | 0.83nm/cycle |

METHOD OF MANUFACTURING SEMICONDUCTOR DEVICE, SUBSTRATE PROCESSING APPARATUS AND RECORDING MEDIUM

CROSS-REFERENCE TO RELATED APPLICATION

This application is a continuation application of U.S. patent application Ser. No. 16/990,683, filed Aug. 11, 2020 which is a bypass continuation Application of International Patent Application No. PCT/JP2018/012089, filed on Mar. 26, 2018, the entire contents of which are incorporated herein by reference.

TECHNICAL FIELD

The present disclosure relates to a method of manufacturing a semiconductor device, a substrate processing apparatus and a recording medium.

BACKGROUND

As one of processes of manufacturing a semiconductor device, a process of embedding a metal film into a concave portion formed on a surface of a substrate may be performed.

SUMMARY

The present disclosure provides some embodiments of a technique capable of improving the quality and productivity of a process of embedding a metal film into a concave portion provided on a surface of a substrate.

According to some embodiments of the present disclosure, there is provided a technique that performs:

(a) forming a first metal film by supplying a plurality of times a first metal-containing gas and a first reducing gas without being mixed with each other to a substrate having a concave portion on a surface of the substrate; and (b) forming a second metal film on the first metal film by supplying a plurality of times at least a second metal-containing gas and a second reducing gas different from the first reducing gas without being mixed with each other or by simultaneously supplying at least a second metal-containing gas and a second reducing gas different from the first reducing gas, to the substrate.

BRIEF DESCRIPTION OF DRAWINGS

FIG. 6 is a flowchart showing a modification of the substrate processing sequence according to an embodiment of the present disclosure.

DETAILED DESCRIPTION

Some Embodiments of the Present Disclosure

Some embodiments of the present disclosure will now be described with reference to FIGS. 1 to 4 and FIGS. 5A to 5E.

(1) Configuration of Substrate Processing Apparatus

Figure 1:
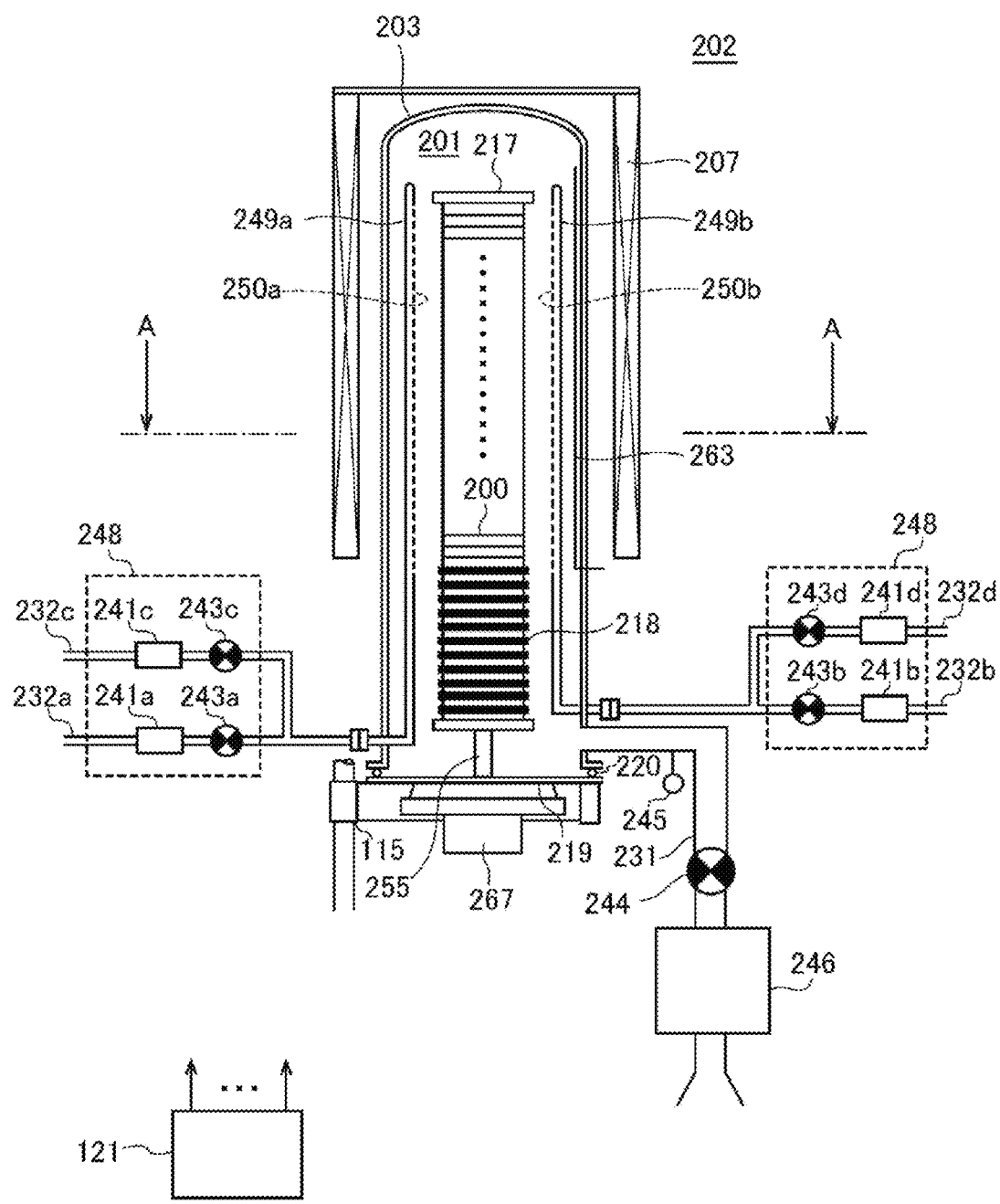
FIG. 1 is a schematic configuration diagram of a vertical process furnace of a substrate processing apparatus suitably used in an embodiment of the present disclosure, in which the process furnace portion is shown in a vertical sectional view.

As shown in FIG. 1, a process furnace 202 includes a heater 207 as a heating mechanism (temperature adjustment part). The heater 207 has a cylindrical shape and is vertically installed by being supported by a holding plate. The heater 207 also functions as an activation mechanism (excitation part) that activates (excites) a gas with heat.

A reaction tube 203 is arranged inside the heater 207 to be concentric with the heater 207. The reaction tube 203 is made of a heat-resistant material such as, for example, quartz ($SiO_2$) or silicon carbide (SiC), and is formed in a cylindrical shape with an upper end thereof closed and a lower end thereof opened. A process chamber 201 is formed in the hollow cylindrical portion of the reaction tube 203. The process chamber 201 is configured to be capable of accommodating wafers 200 as substrates.

Nozzles 249a and 249b are installed in the process chamber 201 to penetrate the lower side wall of the reaction tube 203. Gas supply pipes 232a and 232b are connected to the nozzles 249a and 249b, respectively.

Mass flow controllers (MFC) 241a and 241b as flow rate controllers (flow rate control parts) and valves 243a and 243b as opening/closing valves are installed in the gas supply pipes 232a and 232b sequentially from the upstream side of a gas flow. Gas supply pipes 232c and 232d are connected to the gas supply pipes 232a and 232b, respectively, at the downstream side of the valves 243a and 243b. MFCs 241c and 241d and valves 243c and 243d are respectively installed in the gas supply pipes 232c and 232d sequentially from the upstream side of a gas flow.

Figure 2:
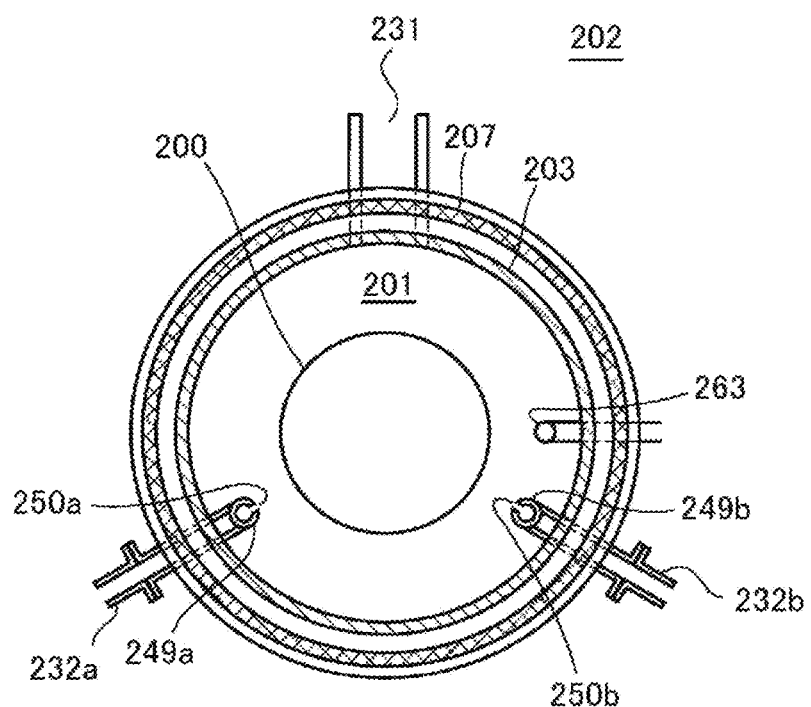
FIG. 2 is a schematic configuration diagram of the vertical process furnace of the substrate processing apparatus suitably used in the embodiment of the present disclosure, in which the process furnace portion is shown in a sectional view taken along line A-A in FIG. 1.

As shown in FIG. 2, the nozzles 249a and 249b are arranged in a space having an annular shape in a plane view between the inner wall of the reaction tube 203 and the wafers 200 such that the nozzles 249a and 249b extend upward along an arrangement direction of the wafers 200 from the lower portion to the upper portion of the inner wall of the reaction tube 203. Specifically, the nozzles 249a and 249b are installed at a lateral side of a wafer arrangement region, in which the wafers 200 are arranged, namely in a region which horizontally surrounds the wafer arrangement region, to extend along the wafer arrangement region. Gas supply holes 250a and 250b for supplying gases are installed on the side surfaces of the nozzles 249a and 249b, respectively. The gas supply holes 250a and 250b are opened to face the center of the reaction tube 203, so as to allow a gas to be supplied toward the wafers 200. The gas supply holes 250a and 250b are formed in a plural number between the lower portion of the reaction tube 203 and the upper portion of the reaction tube 203.

As a first or second metal-containing gas (precursor gas), a gas containing a metal element (atom) and a halogen element, that is, a halogen-based compound is supplied from the gas supply pipe 232a, into the process chamber 201 via the MFC 241a, the valve 243a and the nozzle 249a. As the first or second metal-containing gas, for example, a tungsten hexafluoride ($WF_6$) gas may be used.

An etching gas is supplied from the gas supply pipe 232a into the process chamber 201 through the MFC 241a, the valve 243a and the nozzle 249a. As the etching gas, for example, a nitrogen trifluoride ($NF_3$) gas, which is a gas containing a halogen element, may be used.

As a first reducing gas (first reaction gas having a reducing property), a gas composed of a simple element of hydrogen (H) (composed of only an H element) is supplied from the gas supply pipe 232b into the process chamber 201 via the MFC 241b, the valve 243b and the nozzle 249b. As the first reducing gas, for example, a hydrogen ($H_2$) gas may be used.

As a second reducing gas (a second reaction gas having a reducing property) different from the first reducing gas, an H-containing gas, that is, a compound containing an H element and an element other than the H element (a compound containing an H element) is supplied from the gas supply pipe 232b into the process chamber 201 via the MFC 241b, the valve 243b and the nozzle 249b. As the second reducing gas, for example, a monosilane ($SiH_4$, abbreviation: MS) gas containing an H element and a silicon (Si) element may be used.

From the gas supply pipes 232c and 232d, a nitrogen ($N_2$) gas as inert gas is supplied into the process chamber 201 via the MFCs 241c and 241d, the valves 243c and 243d, the gas supply pipes 232a and 232b, and the nozzles 249a and 249b. The $N_2$ gas acts as a purge gas, a carrier gas, or the like.

Each of a precursor gas supply system and an etching gas supply system is mainly constituted by the gas supply pipe 232a, the MFC 241a and the valve 243a. Each of first and second reducing gas supply systems is mainly constituted by the gas supply pipe 232b, the MFC 241b and the valve 243b. An inert gas supply system is mainly constituted by the gas supply pipes 232c and 232d, the MFCs 241c and 241d, and the valves 243c and 243d. Some or all of the various supply systems may be collectively referred to as a gas supply system.

One or all of the above-described various supply systems may be configured as an integrated supply system 248 in which the valves 243a to 243d, the MFCs 241a to 241d and the like are integrated. The integrated supply system 248 is connected to each of the gas supply pipes 232a to 232d so that the supply operations of various gases into the gas supply pipes 232a to 232d, that is, the opening and closing operations of the valves 243a to 243d, the flow rate adjustment operations by the MFCs 241a to 241d, and the like are controlled by the controller 121 which will be described later. The integrated supply system 248 is formed of integral type or a division type integrated units and is also configured so that it is detachable from the gas supply pipes 232a to 232d and the like, so as to perform maintenance, replacement, expansion and the like of the integrated supply system 248 on an integrated unit basis.

An exhaust pipe 231 configured to exhaust an internal atmosphere of the process chamber 201 is connected to the lower portion of the side wall of the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an APC (Auto Pressure Controller) valve 244 as a pressure regulator (pressure regulation part). The APC valve 244 is configured so that a vacuum exhaust and a vacuum exhaust stop of the interior of the process chamber 201 can be performed by opening and closing the APC valve 244 while the vacuum pump 246 is operated and so that the internal pressure of the process chamber 201 can be regulated by adjusting the valve opening degree based on the pressure information detected by the pressure sensor 245 while operating the vacuum pump 246. An exhaust system is mainly constituted by the exhaust pipe 231, the pressure sensor 245 and the APC valve 244. The vacuum pump 246 may be regarded as being included in the exhaust system.

A seal cap 219, which serves as a furnace port lib capable of hermetically sealing the lower end opening of the reaction tube 203, is installed below the reaction tube 203. The seal cap 219 is made of a metallic material such as, for example, stainless steel (SUS) or the like, and is formed in a disc shape. An O-ring 220, which is a seal member making contact with the lower end portion of the reaction tube 203, is installed on an upper surface of seal cap 219. A rotation mechanism 267 configured to rotate a boat 217, which will be described later, is installed below the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer device (transfer mechanism) that loads and unloads (transfers) the wafers 200 into and out of (from) the process chamber 201 by moving the seal cap 219 up and down.

A boat 217 serving as a substrate support tool is configured so as to support a plurality of wafers 200, for example, 25 to 200 wafers 200, in such a state that wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat-resistant material such as, for example, quartz or SiC. Heat insulating plates 218 made of a heat-resistant material such as, for example, quartz or SiC, are supported in a horizontal posture and in multiple stages at a lower portion of the boat 217.

A temperature sensor 263 serving as a temperature detector is installed in the reaction tube 203. Based on the temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
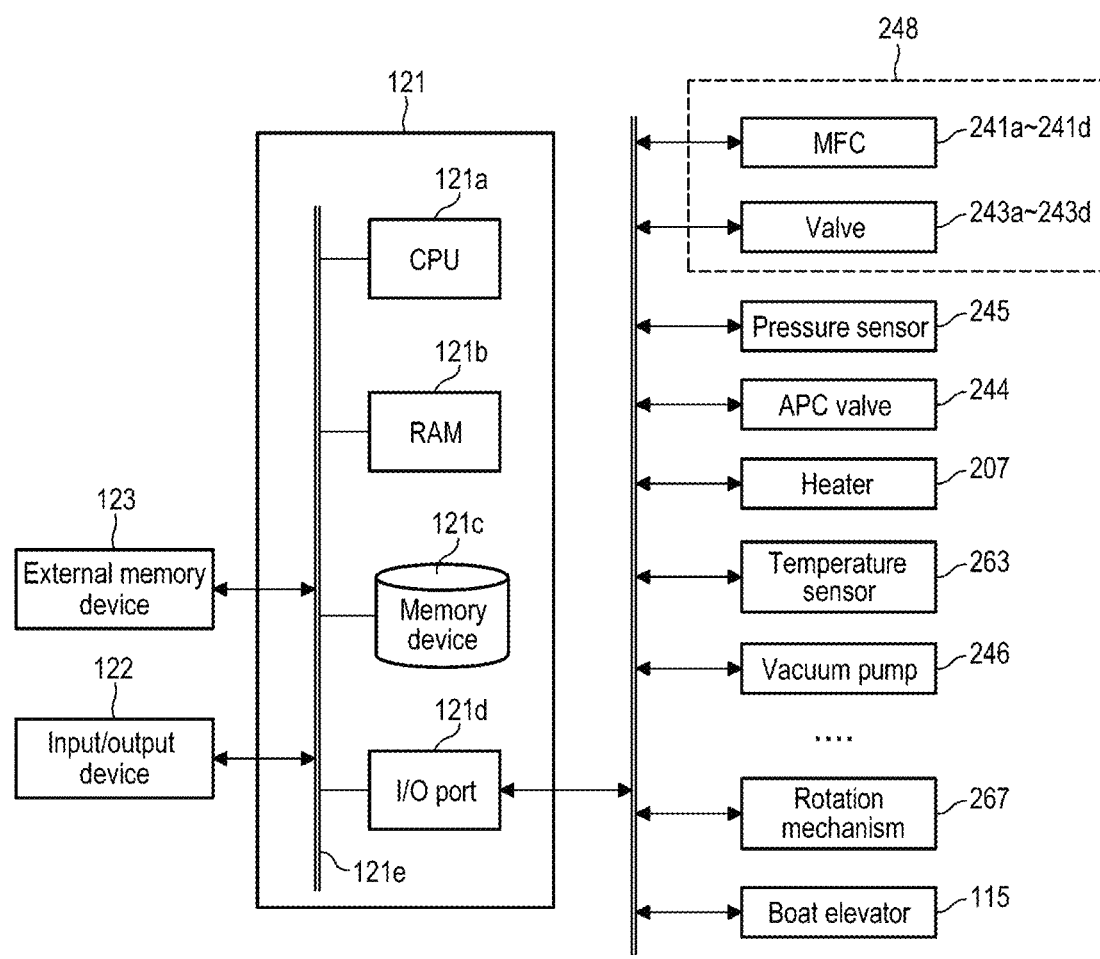
FIG. 3 is a schematic configuration diagram of a controller of the substrate processing apparatus suitably used in the embodiment of the present disclosure, in which a control system of the controller is shown in a block diagram.

As shown in FIG. 3, the controller 121, which is a control part (control means), may be configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like is connected to the controller 121.

The memory device 121c is composed of, for example, a flash memory, an HDD (Hard Disk Drive), or the like. A control program for controlling operations of the substrate processing apparatus, a process recipe for specifying sequences and conditions of substrate processing as described later, or the like is readably stored in the memory device 121c. The process recipe is a combination for causing the controller 121 to execute the respective procedures in a below-described substrate processing process to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may indicate a case of including only the recipe, a case of including only the control program, or a case of including both the recipe and the control program. The RAM 121b is configured as a memory area (work area) in which programs, data and the like read by the CPU 121a are temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and the like.

The CPU 121a is configured to read the control program from the memory device 121c and execute the same. The CPU 121a also reads the recipe from the memory device 121c according to an input of an operation command from the input/output device 122 or the like. The CPU 121a is configured to control, according to the contents of the recipe thus read, the flow rate adjusting operation of various gases by the MFCs 241a to 241d, the opening and closing operations of the valves 243a to 243d, the opening and closing operation of the APC valve 244, the pressure regulating operation by the APC valve 244 based on the pressure sensor 245, the driving and stopping of the vacuum pump 246, the temperature adjusting operation of the heater 207 based on the temperature sensor 263, the operation of rotating the boat with the rotation mechanism 267 and adjusting the rotation speed of the boat 217, the operation of moving the boat 217 up and down by the boat elevator 115, and the like.

The controller 121 may be configured by installing, in the computer, the above-described program stored in an external memory device 123. The external memory device 123 may include, for example, a magnetic disk such as an HDD, an optical disk such as a CD, a magneto-optical disk such as an MO, a semiconductor memory such as a USB memory, and so forth. The memory device 121c or the external memory device 123 is configured as a computer readable recording medium. Hereinafter, the memory device 121c and the external memory device 123 are collectively and simply referred to as a recording medium. When the term "recording medium" is used herein, it may indicate a case of including only the memory device 121c, a case of including only the external memory device 123, or a case of including both. The program may be supplied to the computer by using a communication means such as the Internet or a dedicated line instead of using the external memory device 123.

(2) Substrate Processing Process

As one process of manufacturing a semiconductor device using the substrate processing apparatus described above, an example of a substrate processing sequence in which a tungsten film (W film) is embedded in a concave portion of a wafer 200 as a substrate will be described mainly with reference to FIGS. 4 and 5A to 5E. In the following description, the operations of the respective parts, which constitute the substrate processing apparatus, are controlled by the controller 121.

Figure 4:
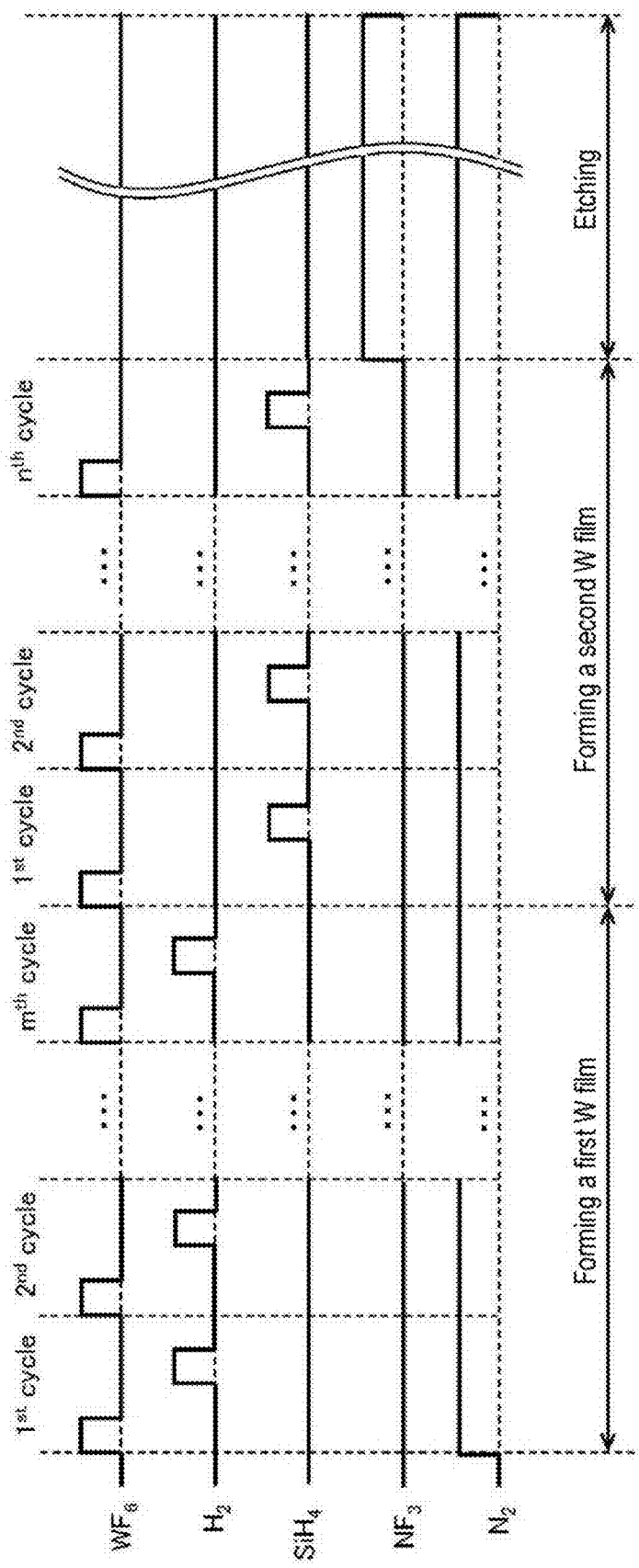
FIG. 4 is a flowchart showing a substrate processing sequence according to an embodiment of the present disclosure.

In the substrate processing sequence shown in FIG. 4, there are performed:
  a step of forming a first metal film (first W film) by supplying a plurality of times a $WF_6$ gas as a first metal-containing gas and a $H_2$ gas as a first reducing gas without being mixed with each other to a wafer 200 having a concave portion;
  a step of forming a second metal film (second W film) on the first W film by supplying a plurality of times at least a $WF_6$ gas as a second metal-containing gas and an MS gas as a second reducing gas without being mixed with each other to the wafer 200; and
  a step of etching at least the second W film by supplying an $NF_3$ gas as an etching gas to the wafer 200.

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" is used herein, it may be synonymous with the term "wafer."

(Wafer Charging and Boat Loading)

A plurality of wafers 200 is charged to the boat 217 (wafer charging). Thereafter, as shown in FIG. 1, the boat 217 supporting the plurality of wafers 200 is lifted by the boat elevator 115 and is loaded into the process chamber 201 (boat loading). In this state, the seal cap 219 seals the lower end of the reaction tube 203 via the O-ring 220.

Figure 5A:
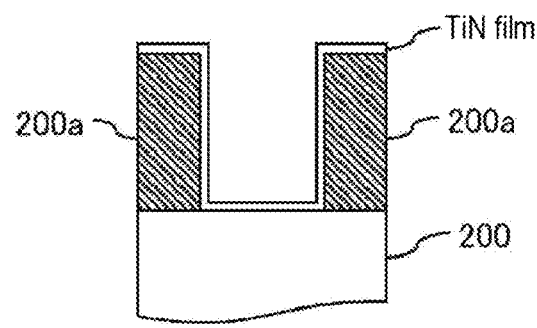
FIG. 5A is an enlarged sectional view showing a surface structure of a wafer before forming a first W film.

As the wafer 200, for example, a Si substrate formed of monocrystalline Si or a substrate having a monocrystalline Si film formed on its surface may be used. As shown in FIG. 5A, a concave portion is provided on the surface of the wafer 200. The bottom portion of the concave portion is formed of monocrystalline Si. The side portion and the top portion of the concave portion are formed of an insulating film 200a such as a silicon oxide film (SiO film), a silicon nitride film (SiN film), a silicon oxycarbonitride film (SiOCN film) or the like. The surface of the wafer 200, namely the bottom surface, the side surface and the top surface of the concave portion may be covered with a titanium nitride film (TiN film) as a barrier film.

(Pressure Regulation and Temperature Adjustment)

The interior of the process chamber 201, namely the space in which the wafer 200 located, is vacuum-exhausted (depressurization-exhausted) by the vacuum pump 246 to reach a desired pressure (degree of vacuum). In this operation, the internal pressure of the process chamber 201 is measured by the pressure sensor 245, and the APC valve 244 is feedback-controlled based on the measured pressure information. Furthermore, the wafer 200 in the process chamber 201 is heated by the heater 207 to a desired temperature (film-forming temperature). In this operation, the state of supplying electric power to the heater 207 is feedback-controlled based on the temperature information detected by the temperature sensor 263 such that the interior of the process chamber 201 has a desired temperature distribution. In addition, the rotation of the wafer 200 by the rotation mechanism 267 begins. The driving of the vacuum pump 246 and the heating and rotation of the wafer 200 are continuously performed at least until the processing on the wafer 200 is completed.

(First W Film-Forming Step)

Thereafter, the following two steps, namely steps 1a and 2a are sequentially performed.

[Step 1a]

A $WF_6$ gas is supplied to the wafer 200 in the process chamber 201. In this step, the valve 243a is opened to allow the $WF_6$ gas to flow into the gas supply pipe 232a. The flow rate of the $WF_6$ gas is adjusted by the MFC 241a. The $WF_6$ gas is supplied into the process chamber 201 via the nozzle 249a and is exhausted from the exhaust pipe 231. At this time, the $WF_6$ gas is supplied to the wafer 200 (first metal-containing gas supply step). At this time, the valves 243c and 243d are opened to allow an $N_2$ gas to flow into the gas supply pipes 232c and 232d. The flow rate of the $N_2$ gas is adjusted by the MFCs 241c and 241d. The $N_2$ gas is supplied into the process chamber 201 via the nozzles 249a and 249b and is exhausted from the exhaust pipe 231. The supply of the $N_2$ gas into the process chamber 201 in the first metal-containing gas supply step may not be carried out.

An example of the processing conditions in this step may be described as follow.

$WF_6$ gas supply flow rate: 1 to 5000 sccm $N_2$ gas supply flow rate (in each gas supply pipe): 0 to 30000 sccm Gas supply time: 0.01 to 10 seconds, specifically 0.1 to 5 seconds Processing temperature (film-forming temperature): 200 to 600 degrees C., specifically 300 to 500 degrees C.

Processing pressure: 1 to 3990 Pa

Furthermore, in the present disclosure, the expression of a numerical range such as "200 to 600 degrees C." may mean that a lower limit value and an upper limit value are included in that range. Therefore, "200 to 600 degrees C." may mean "200 degrees C. or more and 600 degrees C. or less." The same applies to other numerical ranges.

By supplying the $WF_6$ gas to the wafer 200 under the above-described conditions, a W-containing layer (first W-containing layer) containing fluorine (F) is formed on the wafer 200. The first W-containing layer may be an adsorption layer of the $WF_6$ gas, a W layer containing F, or both.

After forming the first W-containing layer, the valve 243a is closed and the supply of the $WF_6$ gas into the process chamber 201 is stopped. Then, the interior of the process chamber 201 is vacuum-exhausted to remove the gas and the like, which remain in the process chamber 201, from the interior of the process chamber 201. In this operation, the valves 243c and 243d are opened and the $N_2$ gas is supplied into the process chamber 201. The $N_2$ gas acts as a purge gas (purging step).

As the first metal-containing gas, other fluorotungsten-based gases may be used in addition to the $WF_6$ gas. Furthermore, as the first metal-containing gas, it may be possible to use, for example, a chlorotungsten-based gas such as a hexachlorotungsten ($WCl_6$) gas, a dichlorotungsten ($WCl_2$) gas, an oxytetrachlorotungsten ($WOCl_4$) gas, an azidopentachlorotungsten ($Cl_5N_3W$) gas or the like. This point also applies to step 1b described later.

As the inert gas, a rare gas such as an Ar gas, a He gas, a Ne gas, a Xe gas or the like may be used in addition to the $N_2$ gas. This point also applies to each step described later.

[Step 2a]

After step 1a is completed, an $H_2$ gas is supplied to the wafer 200 in the process chamber 201. In this step, the opening/closing control of the valves 243b to 243d is performed in the same procedure as the opening/closing control of the valves 243a, 243c and 243d in step 1a. The flow rate of the $H_2$ gas is adjusted by the MFC 241b. The $H_2$ gas is supplied into the process chamber 201 via the nozzle 249b and is exhausted from the exhaust pipe 231. At this time, the $H_2$ gas is supplied to the wafer 200 (first reducing gas supply step).

An example of the processing conditions at this step may be described as follows.

$H_2$ gas supply flow rate: 1 to 30000 sccm

Gas supply time: 0.05 to 60 seconds

Other processing conditions are the same as those in step 1a.

By supplying the $H_2$ gas to the wafer 200 under the above-described conditions, it becomes possible to cause the first W-containing layer formed on the wafer 200 in step 1a to react with the $H_2$ gas. That is, it is possible to cause F (fluoro group) contained in the first W-containing layer to react with the $H_2$ gas. Thus, F in the first W-containing layer, which reacts with H, can be separated (drawn) from the first W-containing layer. By this reaction, F is desorbed from the first W-containing layer, and the first W-containing layer is changed (modified) to a first layer containing W (first W layer). The first W layer is a layer composed of W alone, namely a layer containing W as a main component.

When forming the first W layer, the F contained in the first W-containing layer and the $H_2$ gas constitute a gaseous substance containing at least one selected from the group of F and H in the process of the modification reaction of the first W-containing layer by using the $H_2$ gas. The gaseous substance is removed from the process chamber 201 via the exhaust pipe 231. That is, impurities such as F or the like in the first W-containing layer are separated from the first W-containing layer by being drawn or desorbed from the first W-containing layer. As a result, the first W layer becomes a layer containing fewer impurities such as F or the like than the first W-containing layer.

If the MS gas, which is an H-containing gas containing an element (Si element) other than an H element, is used as the first reducing gas, Si, which is contained in the MS gas, is incorporated into the first W layer at the time of modification. Therefore, the first W layer may become a high resistance layer. In step 2a, by using the $H_2$ gas containing no element other than the H element, it is possible to reduce impurity concentration of the first W layer and avoid a decrease in conductivity of the first W layer.

Thereafter, the valve 243b is closed and the supply of the $H_2$ gas into the process chamber 201 is stopped. Then, the process chamber 201 is vacuum-exhausted and the gas or the like, which remains in the process chamber 201, is removed from the interior of the process chamber 201 by the same processing procedure as the processing procedure in the purging step of step 1a (purging step).

As the first reducing gas, a deuterium ($D_2$) gas may be used in addition to the $H_2$ gas.

[Performed a Predetermined Number of Times]

A cycle which performs steps 1a and 2a non-simultaneously, namely without causing the $WF_6$ gas and the $H_2$ gas to be mixed with each other, is performed a predetermined number of times (m times where m is an integer of 1 or more), it becomes possible to form a first W film which fills an inside of the concave portion of the wafer 200 and covers the upper surface of the insulating film 200a. By alternately supplying the $WF_6$ gas and the $H_2$ gas to form the first W film, it becomes possible to form the first W film by a surface reaction instead of a gas phase reaction. As a result, it becomes possible to fill the inside of the concave portion with the first W film without generating voids or the like in the concave portion. It is desirable to repeat this cycle a plurality of times until the inside of the concave portion is filled with the first W film. That is, it is desirable that the thickness of the first W layer formed per cycle is set to be smaller than a desired film thickness, and the aforementioned cycle is repeated a plurality of times until the film thickness of the first W film formed by stacking the first W layer reaches the desired film thickness.

Figure 5B:
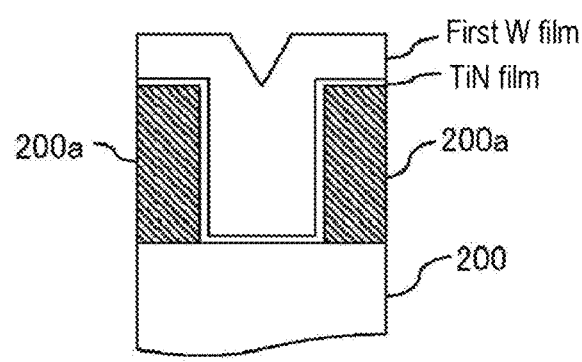
FIG. 5B is an enlarged sectional view showing the surface structure of the wafer after forming the first W film.

As shown in FIG. 5B, a V-shaped concave portion is formed on the upper surface (front surface) of the first W film formed on the concave portion of the wafer 200. By repeating the cycle of performing steps 1a and 1b non-simultaneously for a long period of time, the V-shaped concave portion becomes smaller and eventually disappears, so that the surface of the first W film becomes flat. However, the first W film-forming step is a step which is performed for the purpose of filling the concave portion of the wafer 200 with the first W film. Therefore, if the interior of the concave portion of the wafer 200 is filled with the first W film, it is desirable to early proceed to the second W film-forming step even in a state in which the V-shaped concave portion is formed on the surface of the first W film, that is, even before the surface of the first W film becomes flat. In other words, it is desirable to make the film thickness of the first W film to be remained in a thickness required to completely fill the concave portion of the wafer 200 with the first W film.

It is desirable to make a film thickness of the first W film to be thicker than a thickness of the first W film remaining after performing the etching step to be described below, that is, the thickness of the first W film finally remaining in the concave portion of the wafer 200 (hereinafter also simply referred to as "final thickness"). For example, the film thickness of the first W film is desirably 1.1 to 1.2 times as thick as the final thickness.

When the film thickness of the first W film is less than 1.1 times of the final thickness, since there is variation in processing accuracy of the concave portion of the wafer 200, the concave portion of the wafer 200 may not be completely filled with the first W film. For example, the lower end portion of the aforementioned V-shaped concave portion may be located inside the concave portion of the wafer 200. Furthermore, if the etching progresses excessively, the W film having a desired thickness may not be left on the wafer 200, which may cause deterioration of the quality of the W film. By setting the thickness of the first W film to be 1.1 times or more of the final thickness, it is possible to solve the problem mentioned herein. When the film thickness of the first W film exceeds 1.2 times of the final thickness, the total formation time of the W film formed by stacking the first W film and the second W film becomes long, which may lead to a decrease in substrate processing productivity. By setting the film thickness of the first W film to 1.2 times or less of the final thickness, it is possible to shorten the total formation time of the W film and improve the substrate processing productivity.

When the width of the concave portion of the wafer 200 is, for example, 20 nm, the concave portion can be filled with the first W film by setting the film thickness of the first W film to 10 nm. However, as described above, when considering the variation in the processing accuracy of the concave portion of the wafer 200, it is desirable that the thickness of the first W film is larger than 10 nm, for example, 11 to 12 nm.

(Second W Film-Forming Step)

Thereafter, the following two steps, that is, steps 1b and 2b are sequentially performed.

[Step 1b]

After the first W film-forming step is completed, a $WF_6$ gas is supplied to the wafer 200 in the process chamber 201. In this step, the opening/closing control of the valves 243a, 243c and 243d is performed in the same procedure as the opening/closing control of the valves 243a, 243c and 243d in step 1a. The flow rate of the $WF_6$ gas is adjusted by the MFC 241a. The $WF_6$ gas is supplied into the process chamber 201 through the nozzle 249a and is exhausted from the exhaust pipe 231. At this time, the $WF_6$ gas is supplied to the wafer 200 (second metal-containing gas supply step).

The same processing conditions as the processing conditions in step 1a are exemplified as the processing conditions in this step.

By supplying the $WF_6$ gas to the wafer 200 under the above-described conditions, a W-containing layer containing F (second W-containing layer) is formed on the wafer 200. The second W-containing layer may be an adsorption layer of the $WF^6$ gas, a W layer containing F, or both.

After forming the second W-containing layer, the valve 243a is closed and the supply of the $WF_6$ gas into the process chamber 201 is stopped. Then, the process chamber 201 is vacuum-exhausted, and the gas and the like, which remain in the process chamber 201, are removed from the process chamber 201 by the same processing procedure as the processing procedure in the purging step of step 1a (purging step).

As the second metal-containing gas, the same gas as the above-mentioned first metal-containing gas may be used. The first metal-containing gas and the second metal-containing gas may be the same gas, or may be different gases.

[Step 2b]

After step 1b is completed, an MS gas is supplied to the wafer 200 in the process chamber 201. In this step, the opening/closing control of the valves 243b to 243d is performed in the same procedure as the opening/closing control of the valves 243a, 243c and 243d in step 1a. The flow rate of the MS gas is adjusted by the MFC 241b. The MS gas is supplied into the process chamber 201 via the nozzle 249b and is exhausted from the exhaust pipe 231. At this time, the MS gas is supplied to the wafer 200 (second reducing gas supply step).

An example of the processing conditions in this step may be described as follows.

MS gas supply flow rate: 1 to 3000 sccm
Gas supply time: 0.01 to 30 seconds
Other processing conditions are the same as those in step 1a.

By supplying the MS gas to the wafer 200 under the above-described conditions, it is possible to cause the second W-containing layer formed on the wafer 200 in step 1b to react with the MS gas. That is, it is possible to cause F contained in the second W-containing layer to react with the MS gas. Thus, F in the second W-containing layer, which has been reacted with MS, can be separated (drawn) from the second W-containing layer. By this reaction, F is desorbed from the second W-containing layer, and the second W-containing layer is changed (modified) to a second layer containing W (second W layer). The second W layer is a layer composed of W alone, that is, a layer containing W as a main component.

When forming the second W layer, the F contained in the second W-containing layer and the MS gas constitute a gaseous substance containing at least one selected from the group of F, H and Si in the process of the modification reaction of the second W-containing layer by using the MS gas. The gaseous substance is removed from the process chamber 201 via the exhaust pipe 231. That is, impurities such as F or the like in the second W-containing layer are separated from the second W-containing layer by being withdrawn or desorbed from the second W-containing layer. As a result, the second W layer becomes a layer containing fewer impurities such as F or the like than the second W-containing layer.

A bonding energy of a Si—H bond contained in the MS gas used in step 2b is lower than a bonding energy of a H—H bond contained in the $H_2$ gas used in step 2a. That is, the MS gas has a lower thermal decomposition temperature (is more easily decomposed) than the $H_2$ gas. Therefore, by using the MS gas as the second reducing gas, it is possible to increase the deposition rate of the second W film as compared with the case where the $H_2$ gas is used as the second reducing gas.

Thereafter, the valve 243b is closed and the supply of the MS gas into the process chamber 201 is stopped. Then, the process chamber 201 is vacuum-exhausted, and the gas and the like, which remain in the process chamber 201, are removed from the process chamber 201 by the same processing procedure as the processing procedure in the purging step of step 1a (purging step).

[Performing a Predetermined Number of Times]

Figure 5C:
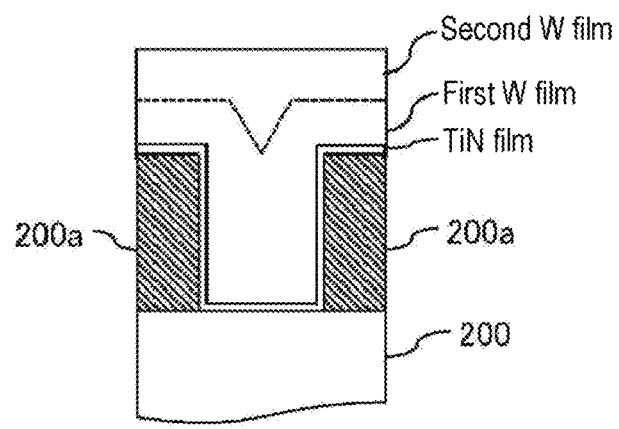
FIG. 5C is an enlarged sectional view showing the surface structure of the wafer after forming a second W film on the first W film.

A cycle which performs steps 1b and 2b non-simultaneously, that is, without causing the $WF_6$ gas and the MS gas to be mixed with each other, is performed a predetermined number of times (n times where n is an integer of 1 or more), so that it becomes possible to form a second W film on the first W film as shown in FIG. 5C. That is, it is possible to form a W film having a predetermined film thickness (hereinafter also simply referred to as "W film") formed by sequentially stacking the first W film and the second W film on the wafer 200. By repeating the cycle of performing steps 1b and 2b non-simultaneously, the V-shaped concave portion disappears eventually, and the upper surface (front surface) of the second W film, that is, the upper surface of the W film becomes flat. This cycle is desirably repeated a plurality of times until the surface of the second W film becomes flat. That is, it is desirable to repeat the aforementioned cycle a plurality of times until the film thickness of the second W film to be formed reaches a desired film thickness so that the surface of the second W film becomes flat by setting the thickness of the second W layer formed per cycle to be smaller than the desired film thickness and stacking the second W layer.

(Etching Step)

After the second W film-forming step is completed, an $NF_3$ gas is supplied to the wafer 200 in the process chamber 201. In this step, the opening/closing control of the valves 243a, 243c and 243d is performed in the same procedure as the opening/closing control of the valves 243a, 243c and 243d in step 1a. The flow rate of the $NF_3$ gas is adjusted by the MFC 241a. The $NF_3$ gas is supplied into the process chamber 201 via the nozzle 249a and is exhausted from the exhaust pipe 231. At this time, the $NF_3$ gas is supplied to the wafer 200 (etching gas supply step).

An example of the processing conditions in this step may be described as follows.

$NF_3$ gas supply flow rate: 1 to 10000 sccm

Gas supply time: 1 to 1800 seconds, specifically 1 to 1200 seconds

Processing temperature: 300 to 600 degrees C., specifically 400 to 500 degrees C.

Other processing conditions are the same as those in step 1a.

By supplying the $NF_3$ gas to the wafer 200 under the above-mentioned conditions, a portion of the W film formed on the wafer 200, that is, at least the second W film can be etched (etching step or etching-back step).

Figure 5D:
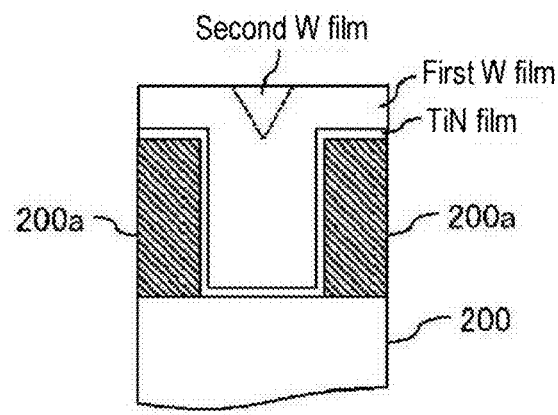
FIG. 5D is an enlarged sectional view showing the surface structure of the wafer in the middle of etching.

Although the first W film and the second W film have different impurity concentrations in the films from each other, they are substantially the same film. Therefore, the etching rates of the first W film and the second W film with respect to the $NF_3$ gas are substantially equal to each other. As a result, it is possible to improve the in-plane uniformity of the wafer in the etching process (hereinafter also simply referred to as "in-plane uniformity"). For example, as shown in FIG. 5D, even when the first W film and the second W film coexist on the surface (etching surface) of the wafer 200 during the etching, it is possible to perform etching at a substantially uniform rate over an entire region of the plane (surface) of the wafer 200. As described above, the surface of the second W film, that is, the surface of the W film becomes a flat surface. Therefore, the etching progresses at a substantially uniform rate over the entire region of the plane of the wafer 200, whereby it is possible to make the surface of the first W film, which finally remains in the concave portion of the wafer 200 after the etching, to be flat.

Figure 5E:
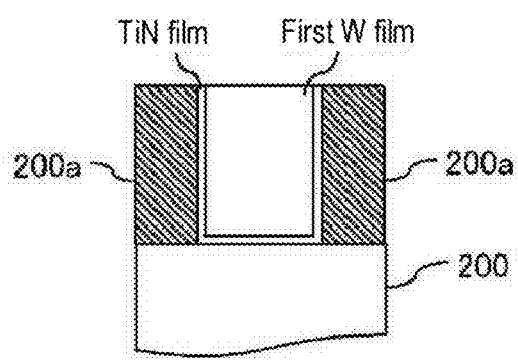
FIG. 5E is an enlarged sectional view showing the surface structure of the wafer after the etching is completed.

After the surface of the W film becomes a flat surface composed of only the first W film as shown in FIG. 5E by etching the W film on the wafer 200 as much as a desired amount, the valve 243a is closed and the supply of the $NF_3$ gas into the process chamber 201 is stopped. Then, the process chamber 201 is vacuum-exhausted, and the gas and the like, which remain in the process chamber 201, are removed from the process chamber 201 by the same processing procedure as the processing procedure in the purging step of step 1a (purging step).

As the etching gas, a hydrogen fluoride (HF) gas, a chlorine trifluoride ($ClF_3$) gas, a fluorine ($F_2$) gas or the like may be used in addition to the $NF_3$ gas.

(After-Purge and Atmospheric Pressure Return)

After the etching step is completed, an $N_2$ gas is supplied into the process chamber 201 from each of the gas supply pipes 232c and 232d and is exhausted from the exhaust pipe 231. As a result, the interior of the process chamber 201 is purged, whereby the gas, the reaction byproduct and the like, which remain in the process chamber 201, are removed from the interior of the process chamber 201 (after-purge). Thereafter, the internal atmosphere of the process chamber 201 is substituted by an inert gas (inert gas substitution), and the internal pressure of the process chamber 201 is returned to the atmospheric pressure (atmospheric pressure return).

(Boat Unloading and Wafer Discharging)

Thereafter, the seal cap 219 is lowered by the boat elevator 115, the lower end of the reaction tube 203 is opened, and the processed wafers 200 supported by the boat 217 are unloaded from the lower end of the reaction tube 203 to the outside of the reaction tube 203 (boat unloading). The processed wafers 200 are taken out to the outside of the reaction tube 203 and then discharged from the boat 217 (wafer discharging).

(3) Effects of the Present Embodiments

According to the present embodiments, one or more of the following effects may be obtained.

(a) It is possible to improve the total productivity of the W film can be improved by forming the first W film to fill the concave portion of the wafer 200 by using the $WF_6$ gas and the $H_2$ gas and then forming the second W film until the surface of the second W film becomes flat by using the $WF_6$ gas and the MS gas. That is, the modification rate of the second W film, which is formed by using the MS gas whose thermal decomposition temperature is lower than that of the $H_2$ gas, is higher than the modification rate of the first W film formed by using the $H_2$ gas. Therefore, in the present embodiments, the productivity of the W film-forming process can be improved as compared with the case where the W film is formed by using only the $H_2$ gas as the reducing gas. As a result, it is possible to improve the productivity of the process of filling the concave portion provided on the surface of the wafer 200 with the W film.

(b) By using a gas composed of only a H element, that is, a gas containing no element other than a H element, such as Si or boron (B), as the first reducing gas, it is possible to prevent impurities from being incorporated into the first W film due to the first reducing gas. As a result, it is possible to reduce the impurity concentration in the first W film and avoid a decrease in conductivity of the first W film. That is, it is possible to allow the first W film to become a film having a high quality and improve the quality of the process of filling the concave portion of the wafer 200 with the W film.

(c) By making sure that the first W film, which is finally remains on the wafer 200 after etching, becomes a high-quality film having a low impurity concentration and that the second W film, which is removed by etching, becomes a film having a high impurity concentration and a high deposition rate, it is possible to improve the quality and productivity of the process of filling the concave portion of the wafer 200 with the W film.

(d) Since the first W film and the second W film have substantially the same etching rate, it is possible to improve the in-plane uniformity of the etching process and flatten the surface of the W film, which finally remain in the concave portion of the wafer 200.

(e) By forming the first W film by an alternate supply method of alternately supplying the first metal-containing gas ($WF_6$ gas) and the first reducing gas ($H_2$ gas) to the wafer 200, it is possible to form the first W film by a surface reaction rather than a gas phase reaction. As a result, the step coverage (step coverage characteristic) of the first W film can be improved as compared with the case of using a simultaneous supply method in which the $WF_6$ gas and the $H_2$ gas are simultaneously supplied to the wafer 200. This makes it possible to avoid generation of voids or the like in the concave portion. As a result, it becomes possible to completely fill the concave portion, that is, to fill the concave portion in a void-free state without a gap with first W film. By alternately supplying the $WF_6$ gas and the $H_2$ gas to form the first W film, it becomes possible to fill the concave portion without generating voids or the like in the concave portion with the first W film.

(f) By forming the second W film by an alternate supply method of alternately supplying the second metal-containing gas ($WF_6$ gas) and the second reducing gas (MS gas) to the wafer 200, it is possible to improve the step coverage characteristic of the second W film as compared with the case of using a simultaneous supply method in which the $WF_6$ gas and the MS gas are simultaneously supplied to the wafer 200. This makes it possible to enhance the controllability of the film thickness control of the second W film.

(g) By forming the second film having a stress value lower than that of the first W film, that is, the second W film having a smaller internal stress (smaller film stress) than the first W film, on the first W film, it is possible to reduce the stress applied to the first W film and suppress the deformation or collapse of the first W film when performing etching.

(h) The above-described effects can be similarly achieved in the case where the aforementioned precursor gas other than the $WF_6$ gas is used, in the case where the aforementioned etching gas other than the $NF_3$ gas is used, or in the case where the aforementioned inert gas other than the $N_2$ gas is used.

(4) Modifications

The present embodiments may be modified as in the following modifications. These modifications may be arbitrarily combined. Unless otherwise specified, the processing procedure and processing conditions in each step of each modification are the same as the processing procedure and processing conditions in each step of the substrate processing sequence described above.

(Modification 1)

As the second reducing gas, a diborane ($B_2H_6$, abbreviation: DB) gas, a dichlorosilane ($SiH_2Cl_2$, abbreviation: DCS) gas, a disilane ($Si_2H_6$, abbreviation: DS) gas, an ammonia ($NH_3$) gas and the like may be used. Even when these gases are used, it is possible to obtain the same effects as those of the substrate processing sequence shown in FIG. 4.

When the DB gas is used as the second reducing gas, an example of the processing conditions in step 2b may be described as follows.

DB gas supply flow rate: 1 to 20000 sccm
Gas supply time: 0.1 to 60 seconds
Processing temperature: 150 to 400 degrees C.

Other processing conditions are the same as those in step 1a. In this case, it is desirable that the processing temperature in step 1b be the same as the processing temperature in step 2b.

When the DCS gas is used as the second reducing gas, an example of the processing conditions in step 2b may be described as follows.

DCS gas supply flow rate: 1 to 2000 sccm
Gas supply time: 0.1 to 60 seconds
Processing temperature: 300 to 600 degrees C.

Other processing conditions are the same as those in step 1a. In this case, it is desirable that the processing temperature in step 1b be the same as the processing temperature in step 2b.

When the DS gas is used as the second reducing gas, an example of the processing conditions in step 2b may be described as follows.

DS gas supply flow rate: 1 to 2000 sccm
Gas supply time: 0.1 to 60 seconds
Processing temperature: 200 to 400 degrees C.

Other processing conditions are the same as those in step 1a. In this case, it is desirable that the processing temperature in step 1b be the same as the processing temperature in step 2b.

When the $NH_3$ gas is used as the second reducing gas, an example of the processing conditions in step 2b may be described as follows.

$NH_3$ gas supply flow rate: 1 to 20000 sccm
Gas supply time: 0.1 to 60 seconds
Processing temperature: 300 to 600 degrees C.

Other processing conditions are the same as those in step 1a. In this case, it is desirable that the processing temperature in step 1b be the same as the processing temperature in step 2b.

Furthermore, as the second reducing gas, two or more kinds of the aforementioned reducing gases may be used.

(Modification 2)

In the above-described embodiments, there has been described the case where the metal element contained in the first and second metal-containing gases is W. However, the present disclosure may not be limited to such an aspect. The present disclosure may be suitably applied to, for example, a case where the metal element contained in the first and second metal-containing gases is a transition metal element such as copper (Cu), cobalt (Co), titanium (Ti), molybdenum (Mo), tantalum (Ta), ruthenium (Ru), hafnium (Hf)), zirconium (Zr) or the like, or a typical metal element such as aluminum (Al) or the like. Even in this modification, the same effects as those of the above-described embodiments may be obtained.

(Modification 3)

In the above-described embodiments, there has been described the example in which the film composed of only W is formed on the wafer 200. However, the present disclosure may not be limited to such an aspect. The present disclosure may be suitably applied to, for example, a case where a film containing a metal element, such as a tungsten nitride (WN) film, a tungsten oxide (WO) film, a tungsten oxynitride (WON) film, a titanium nitride (TiN) film or the like is formed on the wafer 200. In the case of forming these films, in at least one selected from the group of the step of forming the first metal film and the step of forming the second metal film, a cycle that further includes a step of supplying a nitriding gas to the wafer 200 and a step of supplying an oxidizing gas to the wafer 200, in addition to the step of supplying the precursor gas to the wafer 200 and the step of supplying the reducing gas to the wafer 200, may be performed a predetermined number of times. For example, an $NH_3$ gas may be used as the nitriding gas, and an oxygen ($O_2$) gas may be used as the oxidizing gas.

(Modification 4)

The first metal film and the second metal film may be different films from each other. In this case, it is desirable that etching rates of the first metal film and the second metal film are close to each other.

The metal elements contained in the first and second metal-containing gases may be different elements from each other. For example, as in the substrate processing sequence shown in FIG. 6, a $WF_6$ gas may be used as the first metal-containing gas to form a W film as the first metal film, and a titanium tetrachloride ($TiCl_4$) gas may be used as the second metal-containing gas to form a Ti film as the second metal film. Even in this modification, the same effects as those of the above-described embodiments can be obtained.

A film composed of a metal alone may be formed as the first metal film, and a film containing a metal element may be formed as the second metal film. For example, a W film may be formed as the first metal film, and a WN film, a WO film, a TiN film or the like may be formed as the second metal film. In addition, for example, it is more desirable to form a W film as the first metal film and to form a TiN film or a WN film having a smaller film stress than the W film, as the second metal film.

(Modification 5)

Figure 7:
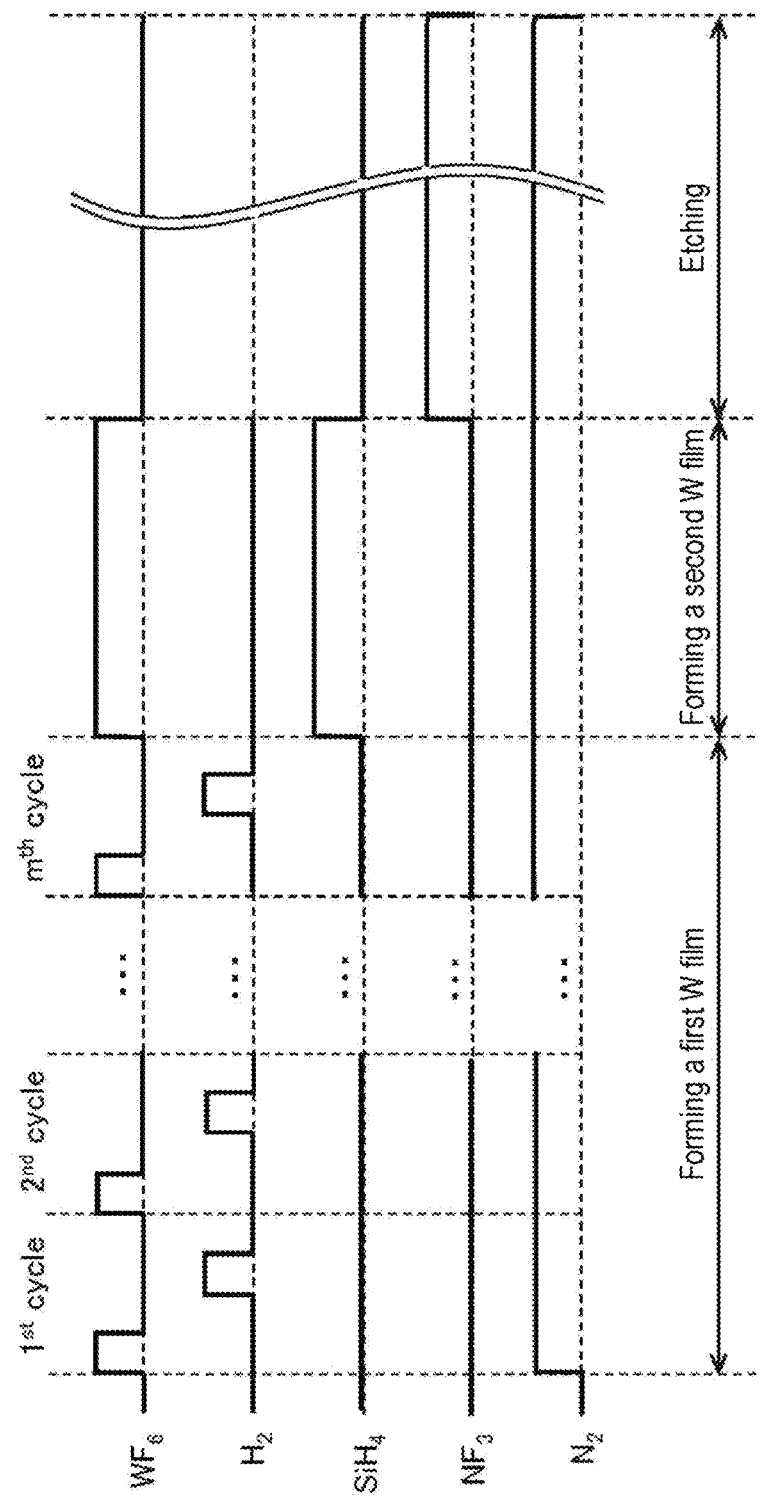
FIG. 7 is a flowchart showing another modification of the substrate processing sequence according to an embodiment of the present disclosure.

In the second W film-forming step, the $WF_6$ gas and the MS gas may be simultaneously supplied as in the substrate processing sequence shown in FIG. 7. Even in this modification, the same effects as those of the substrate processing sequence shown in FIG. 4 can be obtained. Furthermore, by forming the second W film by the simultaneous supply method, a deposition rate of the second W film can be improved as compared with the case of using the alternate supply method. As a result, it is possible to further improve the total deposition rate of the W film formed by stacking the first W film and the second W film. However, as described above, it is desirable to form the second W film by the alternate supply method because the controllability of the film thickness control of the second W film can be improved in that case.

(Modification 6)

In the substrate processing sequence shown in FIG. 4, the $NF_3$ gas is supplied continuously in step 2b. Alternatively, the $NF_3$ gas may be supplied intermittently a plurality of times. Even in this modification, the same effects as those of the substrate processing sequence shown in FIG. 4 can be obtained.

(Modification 7)

In step 2b, an $O_2$ gas may be supplied together with (simultaneously with) the $NF_3$ gas to the wafer 200. In this case, the supply of the $O_2$ gas may be started at the same time as the supply of the $NF_3$ gas, or the supply of the $O_2$ gas may be started prior to the supply of the $NF_3$ gas. Furthermore, the supply of the $NF_3$ gas and the supply of the $O_2$ gas may be stopped at the same time, or the supply of the $NF_3$ gas may be stopped before the stop of the supply of the $O_2$ gas. Even in this modification, the same effects as those of the substrate processing sequence shown in FIG. 4 can be obtained. In addition, by allowing the $O_2$ gas to flow in the etching step, even in the case where a film other than the target film for etching is etched by the etching gas, it is possible to immediately oxidize the etched film. As a result, it is possible to minimize the reaction between the film other than the target film for etching and the etching gas.

Other Embodiments

The embodiments of the present disclosure have been specifically described above. However, the present disclosure is not limited to the above-described embodiments, and various modifications may be made without departing from the scope of the present disclosure.

In the above-described embodiments, there has been described the example in which the reaction tube has a single tube structure. However, the reaction tube may have a double tube structure composed of an inner reaction tube (inner tube) and an outer reaction tube (outer tube) installed outside the inner reaction tube.

In the above-described embodiments, there has been described the example in which the series of steps from the first W film-forming step to the etching step is performed in the same process chamber 201 (in-situ). However, the present disclosure is not limited to such an aspect. For example, the first and second W film-forming steps and the etching step may be performed in different process chambers (ex-situ). Furthermore, for example, the first W film-forming step and the series of step group after the second W film-forming step may be performed ex-situ. In addition, for example, the respective steps may be performed ex-situ. However, if all the steps are performed in-situ, the wafer 200 is not exposed to the atmosphere during the process, so that it is possible to perform processing consistently while keeping the wafer 200 in a clean atmosphere, which makes it possible to perform a stable film-forming process.

The above-described embodiments and modifications may be applied to the metal film-forming step, which is performed as one step of the manufacturing process of a flash memory which is a nonvolatile semiconductor memory device (nonvolatile memory). Hereinafter, the structure of the main part of a three-dimensional NAND flash memory (hereinafter also referred to as 3D NAND) among the NAND flash memories which are one kind of flash memories manufactured by applying the method of the above-described embodiments and modifications will be described with reference to FIG. 8. In this regard, for the sake of convenience, some of the films or structures constituting a 3D NAND will be described, and description of the other films or structures will be omitted.

Figures 8, 9A, 9B:
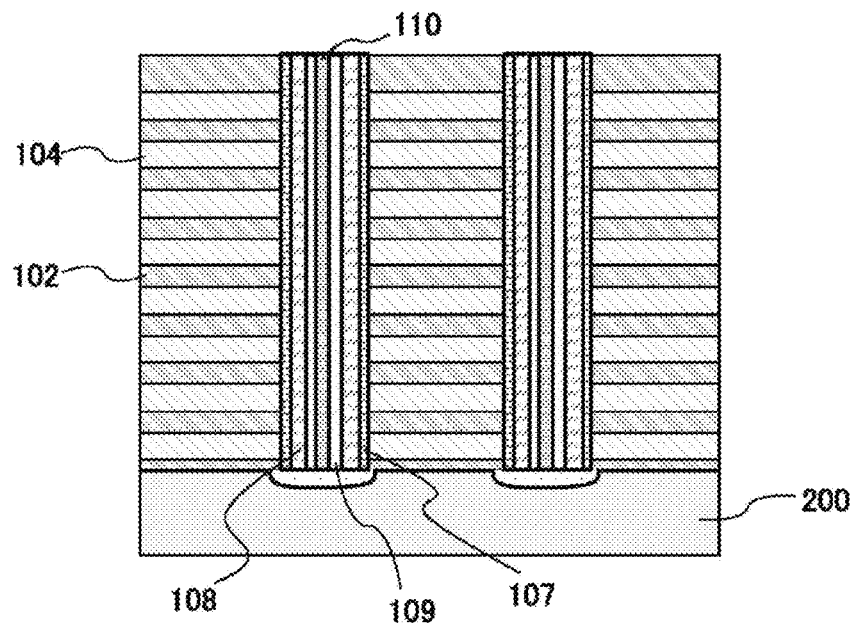
FIG. 8 is a view showing a cross-sectional structure of a main part of a 3D NAND.
FIG. 9A is a view showing the measurement results of the total processing time of processes of forming a first W film and a second W film in an Example and a Comparative Example.
FIG. 9B is a view showing the measurement results of a deposition rate of a first W film and a deposition rate of a second W film.

As shown in FIG. 8, a multilayer stacked film in which an insulating film 102 such as SiO films or the like and a metal film 104 such as W films or the like are alternately stacked in a multilayer, is formed on the surface of the wafer 200. There is shown an example in which the lowermost layer and the uppermost layer are the insulating films 102. The metal film 104 and the like act as a control gate. That is, the metal film 104 and the like acting as a control gate are formed between the insulating films 102 vertically adjacent to each other. Although FIG. 8 shows an example in which the number of stacked layers is eight for the sake of convenience, the present disclosure may not be limited to such a configuration. A channel hole is formed in the multilayer stacked film. In the channel hole, an ONO film, that is, an insulating film 108 composed of three layers of a SiO film, a SiN film and a SiO film, and a channel poly-Si film 109 are sequentially formed from the outer peripheral side. Each of the insulating film 108 and the channel poly-Si film 109 is formed in a tubular shape. The remaining portion in the channel hole, that is, the concave portion formed by the channel poly-Si film 109 is filled with an insulating film (filling insulating film) 110 such as a SiO film or the like. A protective film 107, which is made of a SiO film or a metal oxide film such as aluminum oxide (AlO) or the like, may be formed between the surface of the inner wall of the channel hole and the insulating film 108 to protect the insulating film 108.

Furthermore, the above-described embodiments and modifications may also be applied to a step of forming a metal film for a word line, which is performed as one step of a manufacturing process of a dynamic random access memory (DRAM) or a MOSFET (Metal Oxide Semiconductor Field Effect Transistor).

It is desirable that the recipes used for the substrate processing are prepared separately according to the processing contents and are stored in the memory device 121c via an electric communication line or an external memory device 123. When starting the substrate processing, it is desirable that the CPU 121a properly selects an appropriate recipe from a plurality of recipes stored in the memory device 121c according to the contents of the substrate processing. This makes it possible to form films of various film types, composition ratios, film qualities and film thicknesses with high reproducibility in one substrate processing apparatus. In addition, the burden on an operator can be reduced, and the processing can be quickly started while avoiding operation mistakes.

The above-described recipes may not be limited to the newly-prepared ones, but may be prepared by, for example, changing the existing recipes, which have been already installed in the substrate processing apparatus. In the case of changing the recipes, the recipes after the change may be installed in the substrate processing apparatus via an electric communication line or a recording medium in which the recipes are recorded. In addition, the input/output device 122 provided in the existing substrate processing apparatus may be operated to directly change the existing recipes, which have been already installed in the substrate processing apparatus.

In the above-described embodiments, there has been described an example in which a film is formed using a batch type substrate processing apparatus for processing a plurality of substrates at a time. The present disclosure may not be limited to the above-described embodiments, but may be suitably applied to, for example, a case where a film is formed by using a single-wafer type substrate processing apparatus for processing one or several substrates at a time. Furthermore, in the above-described embodiments, there has been described an example in which a film is formed using a substrate processing apparatus having a hot wall type process furnace. The present disclosure may not be limited to the above-described embodiments, but may also be suitably applied to a case where a film is formed using a substrate processing apparatus having a cold wall type process furnace.

Even in the case of using these substrate processing apparatuses, film formation may be performed under the same processing procedures and processing conditions as those in the above-described embodiments and modifications, and the same effects as those of the above-described embodiments and modifications may be obtained.

In addition, the above-described embodiments and modifications may be used in combination as appropriate. The processing procedures and processing conditions at this time may be the same as, for example, the processing procedures and processing conditions of the above-described embodiments.

Example

An Example will be described below.

In an Example, a W film was formed on a wafer by the substrate processing apparatus shown in FIG. 1 according to the substrate processing sequence shown in FIG. 4. The processing conditions were set to predetermined conditions within the range of the processing conditions of the above-described embodiments.

In a Comparative Example, a W film was formed on a wafer by performing the first W film-forming step using the substrate processing apparatus shown in FIG. 1. In the Comparative Example, the second W film-forming step was not performed. Other processing conditions were the same as the processing conditions used in the Example.

Then, for the Example and the Comparative Examples, the total processing time of the formation process of the first W film and the second W film was measured. The results are shown in FIG. 9A. According to FIG. 9A, it can be noted that the total processing time for forming the first W film and the second W film in the Example is shorter than the total processing time in the Comparative Example. Subsequently, the deposition rate of the first W film in the first W film-forming step and the deposition rate of the second W film in the second W film-forming step were measured. The results are shown in FIG. 9B. According to FIG. 9B, it can be seen that the deposition rate of the second W film is higher than the deposition rate of the first W film. That is, it can be seen from FIGS. 9A and 9B that, by performing the second W film-forming step, it becomes possible to improve the productivity of the substrate processing for embedding the W film into the concave portion of the wafer.

According to the present disclosure, it is possible to of improve the quality and productivity of a process of filling a concave portion provided on a surface of a substrate with a metal film

What is claimed is:

1. A method of processing a substrate having a concave portion in a surface of the substrate, comprising:
    (a) forming a first metal film to fill completely the concave portion by supplying a plurality of times a first metal-containing gas and a first reducing gas without being mixed with each other or by simultaneously supplying the first metal-containing gas and the first reducing gas, to the substrate;
    (b) forming a second metal film on the first metal film by supplying a plurality of times at least a second metal-containing gas and a second reducing gas without being mixed with each other or by simultaneously supplying at least the second metal-containing gas and the second reducing gas, to the substrate; and
    (c) etching an upper portion of the first metal film and the second metal film by supplying an etching gas to the substrate,
    wherein in (a), a thickness of the first metal film before performing (c) is 1.2 times or less of a thickness of the first metal film remaining after performing (c), and
    wherein (c) is performed after (a) and (b).

2. The method of claim 1, wherein the second reducing gas is different from the first reducing gas.

3. The method of claim 1, wherein the first reducing gas is a simple substance of hydrogen.

4. The method of claim 1, wherein the first metal-containing gas and the second metal containing gas are halogen-based compounds.

5. The method of claim 1, wherein the second reducing gas is a compound containing a hydrogen element.

6. The method of claim 1, wherein the second reducing gas is a compound in which a binding energy between elements, which constitute the second reducing gas, is smaller than a binding energy between hydrogen elements.

7. The method of claim 1, wherein the first metal film and the second metal film have substantially a same etching rate with respect to the etching gas.

8. The method of claim 6, wherein the first metal film and the second metal film have substantially a same etching rate with respect to an etching gas.

9. The method of claim 1, wherein metal elements contained in the first metal-containing gas and the second metal-containing gas are a same element.

10. The method of claim 9, wherein the metal elements are any one of tungsten, molybdenum, copper, and cobalt.

11. The method of claim 1, wherein metal elements contained in the first metal-containing gas and the second metal-containing gas are different elements.

12. A method of manufacturing a semiconductor device comprising the method claim 1.

13. A non-transitory computer-readable recording medium storing a program that causes, by a computer, a substrate processing apparatus to perform a process in a process chamber of the substrate processing apparatus, the process comprising:
    (a) forming a first metal film to fill completely a concave portion in a surface of a substrate by supplying a plurality of times a first metal-containing gas and a first reducing gas without being mixed with each other or by simultaneously supplying the first metal-containing gas and the first reducing gas, to the substrate having the concave portion;
    (b) forming a second metal film on the first metal film by supplying a plurality of times at least a second metal-containing gas and a second reducing gas without being mixed with each other or by simultaneously supplying at least the second metal-containing gas and the second reducing gas; and
    (c) etching an upper portion of the first metal film and the second metal film by supplying an etching gas to the substrate,
    wherein in (a), a thickness of the first metal film before performing (c) is 1.2 times or less of a thickness of the first metal film remaining after performing (c), and
    wherein (c) is performed after (a) and (b).

14. A substrate processing apparatus, comprising:
    a process chamber in which a substrate, which has a concave portion in a surface of the substrate, is processed;
    a gas supply system configured to supply a first metal-containing gas, a second metal-containing gas, a first reducing gas, a second reducing gas, and an etching gas, to the substrate in the process chamber; and
    a controller configured to control the gas supply system so as to perform, in the process chamber:
        (a) forming a first metal film to fill completely the concave portion by supplying a plurality of times the first metal-containing gas and the first reducing gas without being mixed with each other or by simultaneously supplying the first metal-containing gas and the first reducing gas, to the substrate;
        (b) forming a second metal film on the first metal film by supplying a plurality of times at least the second metal-containing gas and the second reducing gas without being mixed with each other or by simultaneously supplying at least the second metal-containing gas and the second reducing gas, to the substrate; and
        (c) etching an upper portion of the first metal film and the second metal film by supplying the etching gas to the substrate,
    wherein in (a), a thickness of the first metal film before performing (c) is 1.2 times or less of a thickness of the first metal film remaining after performing (c), and
    wherein (c) is performed after (a) and (b).

* * * * *